(12) United States Patent
Singh et al.

(10) Patent No.: US 9,287,865 B2
(45) Date of Patent: Mar. 15, 2016

(54) CAPACITIVE TOUCH SENSOR CONTROL UNIT WITH SAMPLING CAPACITORS FOR DIFFERENTIAL INTEGRATION

(75) Inventors: Tajeshwar Singh, Klaebu (NO); Trond Pedersen, Trondheim (NO); Terje Saether, Trondheim (NO)

(73) Assignee: Atmel Corporation, San Jose, CA (US)

( * ) Notice: Subject to any disclaimer, the term of this patent is extended or adjusted under 35 U.S.C. 154(b) by 819 days.

(21) Appl. No.: 13/207,108

(22) Filed: Aug. 10, 2011

(65) Prior Publication Data

US 2013/0038566 A1    Feb. 14, 2013

(51) Int. Cl.
*G06F 3/044* (2006.01)
*H03K 17/96* (2006.01)

(52) U.S. Cl.
CPC .. *H03K 17/962* (2013.01); *H03K 2217/960745* (2013.01)

(58) Field of Classification Search
CPC ................................ G06G 3/044; G06F 3/044
USPC ................. 345/174; 341/100, 172; 178/18.06
See application file for complete search history.

(56) References Cited

U.S. PATENT DOCUMENTS

| | | | |
|---|---|---|---|
| 6,214,297 B1 * | 4/2001 | Zhang et al. | 422/186 |
| 7,663,607 B2 | 2/2010 | Hotelling | |
| 7,838,811 B2 | 11/2010 | Otsuka et al. | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2008/0042994 A1* | 2/2008 | Gillespie et al. | 345/174 |
| 2009/0167718 A1* | 7/2009 | Lee et al. | 345/174 |
| 2009/0315854 A1 | 12/2009 | Matsuo | |
| 2010/0110037 A1* | 5/2010 | Huang et al. | 345/174 |
| 2010/0283759 A1* | 11/2010 | Iso et al. | 345/174 |
| 2012/0049868 A1* | 3/2012 | Maharyta | 324/679 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |

FOREIGN PATENT DOCUMENTS

WO    WO 2012/129247    9/2012

OTHER PUBLICATIONS

U.S. Appl. No. 61/454,936, filed Mar. 21, 2011, Myers.
(Continued)

*Primary Examiner* — Mark Regn
(74) *Attorney, Agent, or Firm* — Baker Botts L.L.P.

(57) ABSTRACT

In one embodiment, an apparatus comprises a pulse driver configured to generate an electrical pulse for transmission to a capacitive touch sensor. The apparatus further comprises a timing circuit configured to hold a first switch closed and a second switch open during a first edge of the electrical pulse, and hold the second switch closed and the first switch open during a second edge of the electrical pulse. The apparatus further comprises a first capacitor configured to receive a first amount of charge that is indicative of a capacitance of an area of the capacitive touch sensor and a second capacitor configured to discharge a second amount of charge that is indicative of the capacitance of the area of the capacitive touch sensor. The apparatus further comprises a differential output configured to provide a measure of the voltage difference between the first capacitor and second capacitor.

21 Claims, 5 Drawing Sheets

(56) References Cited

OTHER PUBLICATIONS

U.S. Appl. No. 61/454,950, filed Mar. 21, 2011, Lynch.
U.S. Appl. No. 61/454,894, filed Mar. 21, 2011, Rothkopf.

Office Action of the Intellectual Property Office, ROC (Taiwan) for Patent Application No. 101128820, (Chinese Office Action and Translation) Dec. 31, 2015.

* cited by examiner

CAPACITIVE TOUCH SENSOR CONTROL UNIT WITH SAMPLING CAPACITORS FOR DIFFERENTIAL INTEGRATION

TECHNICAL FIELD

This disclosure generally relates to touch sensors.

BACKGROUND

A touch position sensor can detect the presence and location of a touch by a finger or by another object, such as a stylus. A touch position sensor, for example, can detect the presence and location of a touch within an area of an external interface of the touch position sensor. In a touch sensitive display application, the touch position sensor enables direct interaction with what is displayed on the screen, rather than indirectly with a mouse or touch pad.

There are a number of different types of touch position sensors, such as resistive touch screens, surface acoustic wave touch screens, capacitive touch screens, etc. Touch position sensors can be attached to or provided as part of devices with a display, such as computers, personal digital assistants, satellite navigation devices, mobile telephones, portable media players, portable game consoles, public information kiosks and point of sale systems. Touch position sensors have also been used as control panels on appliances.

BRIEF DESCRIPTION OF THE DRAWINGS

For a more complete understanding of the present disclosure and its features and advantages, reference is now made to the following description, taken in conjunction with the accompanying drawings, in which.

DESCRIPTION OF EXAMPLE EMBODIMENTS

Figure 1:
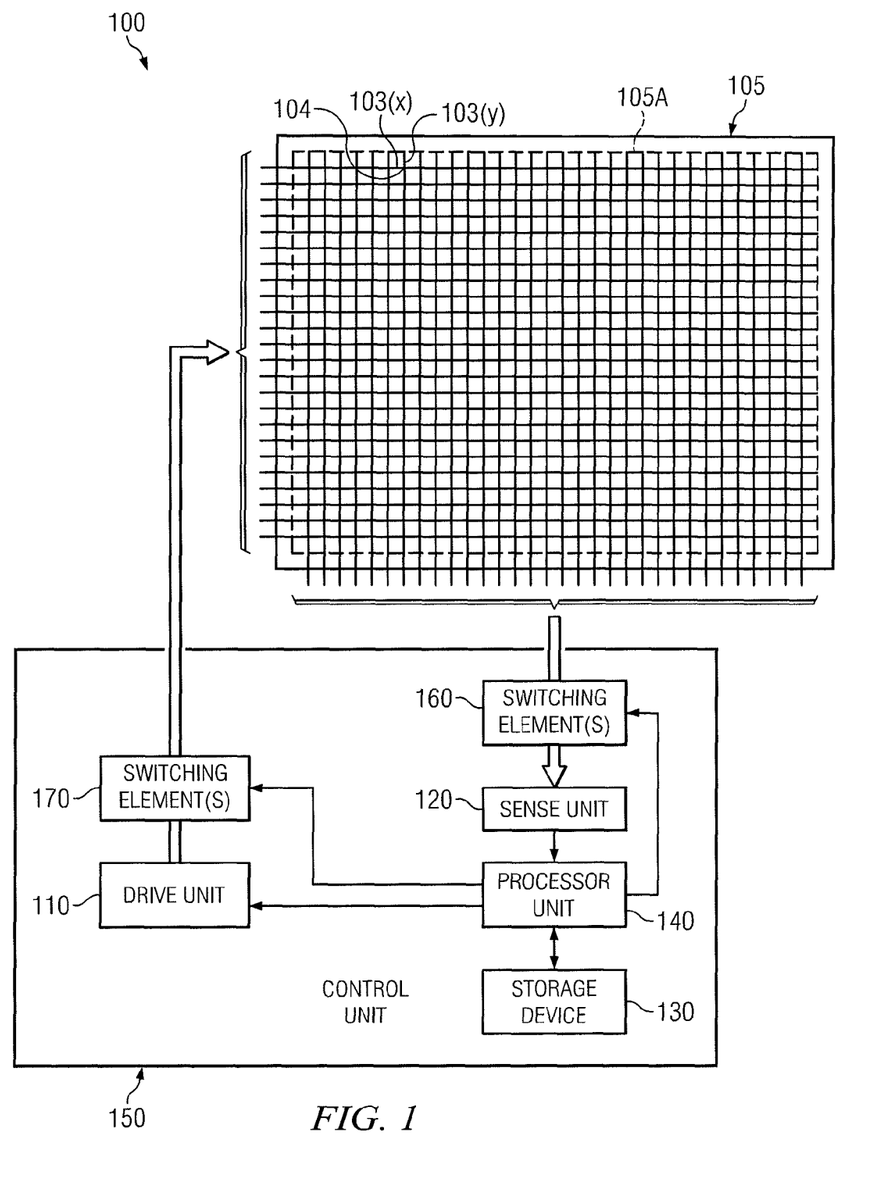
FIG. 1 illustrates an example system comprising a capacitive touch sensor coupled to a control unit.

FIG. 1 illustrates an example system 100 comprising a capacitive touch sensor 105 coupled to a control unit 150. The control unit 150 may include a drive unit 110 comprising a pulse driver configured to generate an electrical pulse for transmission to the capacitive touch sensor 105. The control unit 150 may further comprise a sense unit 120 that includes a timing circuit coupled to a first switch and a second switch. The timing circuit is configured to hold the first switch closed and the second switch open for the duration of a first edge of the electrical pulse and hold the second switch closed and the first switch open for the duration of a second edge of the electrical pulse. The sense unit 120 may further comprise a first capacitor operable to be coupled to the capacitive touch sensor 105 through the first switch. The first capacitor is configured to receive a first amount of charge that is indicative of a capacitance of an area 104 of the capacitive touch sensor 105. The sense unit 120 may further comprise a second capacitor operable to be coupled to the capacitive touch sensor 105 through the second switch, the second capacitor configured to discharge a second amount of charge that is indicative of the capacitance of the area 104 of the capacitive touch sensor. The sense unit 120 may further comprise a differential output coupled to the first capacitor and second capacitor. The differential output is configured to provide, to a portion of a backend circuit of the sense unit, a measure of the voltage difference between the first capacitor and second capacitor.

Capacitive touch sensor 105 of system 100 may include a screen comprising an insulator coated with a transparent conductor in a particular pattern. When a finger or other object touches the surface of the screen, there is a change in capacitance. A signal indicating this change in capacitance may be sent to control unit 150 for processing to determine the position of the touch. In various embodiments, system 100 is operable to process measurements of any suitable type of capacitance, such as surface capacitance, projected capacitance, mutual capacitance, and self or absolute capacitance.

As depicted, capacitive touch sensor 105 includes sensing area 105A. Drive electrodes 103(x) and sense electrodes 103(y) may be formed in the sensing area 105A on one or more substrates. As depicted, the drive electrodes 103(x) run in a horizontal direction and the sense electrodes 103(y) run in a vertical direction. However, the sense and drive electrodes may have any suitable shape and arrangement. Capacitive sensing channels 104 may be formed in the sensing area at the regions where edges of the drive electrodes 103(x) and sense electrodes 103(y) are adjacent. In certain embodiments, drive electrodes 103(x) and sense electrodes 103(y) are arranged in electrical isolation from each other. For example, the drive electrodes 103(x) and the sense electrodes 103(y) of capacitive touch sensor 105 may be arranged on opposite surfaces of an insulating substrate so that the substrate provides electrical isolation between the drive and sense electrodes.

The control unit 150 of system 100 may be in communication with the capacitive touch sensor 105. As depicted, the control unit 150 includes a drive unit 110, a sense unit 120, a storage device 130, and a processor unit 140. The storage device 130 may store programming in a computer-readable storage medium for execution by the processor unit 140 and data used in or resulting from operations of the processor unit 140. In some embodiments, the control unit 150 is an integrated circuit chip such as a general purpose microprocessor, a microcontroller, a programmable logic device/array, an application-specific integrated circuit (ASIC), or a combination thereof. In other embodiments, the drive unit 110, the sense unit 120, and/or the processor unit 140 may be provided in separate control units.

The processor unit 140 controls the drive unit 110 to supply drive signals (such as electrical pulses) to the drive electrodes 103(x), so as to induce charge on the sense electrodes 103(y) that intersect with the drive electrodes 103(x). The sense unit 120 senses charge at the various intersections 104 via the sense electrodes 103(y), and the sense unit 120 provides measurement signals representing node capacitance to the processor unit 140.

In the embodiment depicted, the drive electrodes 103(x) connect to the drive unit 110 via one or more first switching elements 170 and the sense electrodes 103(y) connect to the sense unit 120 via one or more second switching elements 160. The switching elements 160 and 170 are controlled by the processor unit 140. In a particular embodiment, the processor unit 140 controls the switching elements 160 and 170 and the drive and sense units 110 and 120 to implement sensing at all of the intersections 104 on the sensing area 105A and provide full sensing resolution. Each drive electrode 103(x) may be driven, and signals from each sense electrode 103(y) may be sensed. In a different embodiment, the processor unit 140 controls the switching elements 160 and 170 and the drive and sense units 110 and 120 to drive and sense via a smaller number of channels. Selected subsets of the drive and sense electrodes may be used. In this example, the drive signals are applied to groups of drive electrodes 103($x$) forming a smaller number of drive channels, and signals are sensed from groups of sense electrodes 103($y$) forming a smaller number of sense channels.

In a particular embodiment, the processor unit 140 is capable of processing data received from the sense unit 120 and determining the presence and location of a touch on the capacitive touch sensor 105. In a particular embodiment, the presence and location of a touch on the capacitive touch sensor 105 may be determined by detecting a change in capacitance of one or more capacitive sensing channels 104 of the capacitive touch sensor. In some embodiments, the capacitance of one or more capacitive sensing channels 104 may be sampled periodically in order to determine whether the capacitances of the channels have changed.

In typical systems, in order to sense the capacitance of a capacitive sensing channel, a single capacitor of a control unit may be coupled to the capacitive sensing channel. The single capacitor may collect charge induced by a drive signal sent to the capacitive sensing channel. However, a single capacitor is only capable of performing a single ended measurement. An inverting circuit may be placed in between the single capacitor and the capacitive sensing channel so that the single capacitor can collect charge during a rising edge of the drive signal (through a path that does not go through the inverting circuit) and a falling edge of the drive signal (through a path that does include the inverting circuit). However, this method of sensing is susceptible to non-idealities in the path between the capacitive touch sensor and the single capacitor, such as amplifier offset. In some situations, the non-idealities may distort the measurement obtained by the single capacitor.

Figure 2:
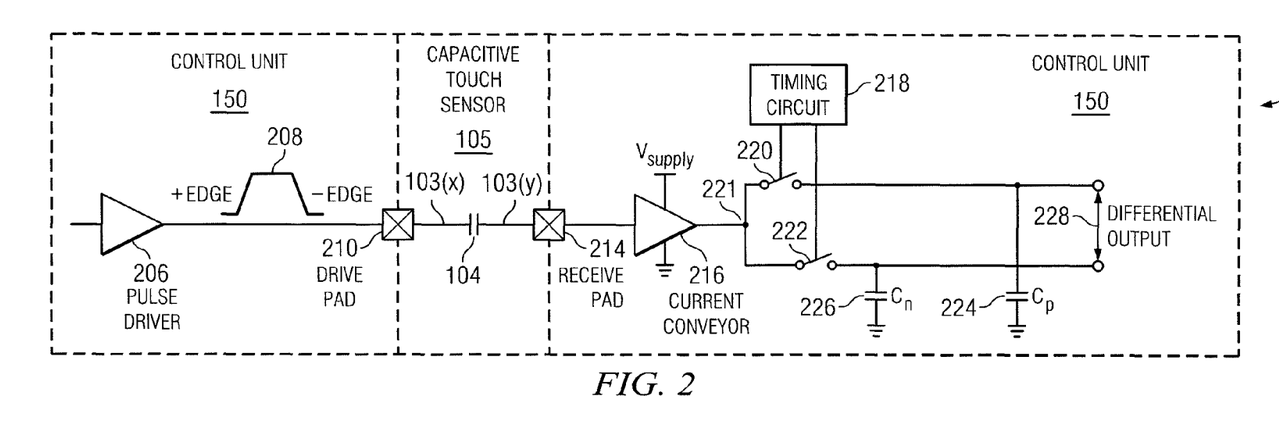
FIG. 2 illustrates an example system comprising a capacitive touch sensor control unit with sampling capacitors for differential integration of a signal indicative of a capacitance.

FIG. 2 illustrates system 100 of FIG. 1 further comprising dual sampling capacitors 224 and 226 for differential integration of a signal indicative of a capacitance of capacitive sensing channel 104. In some embodiments, capacitor 224 is configured to collect charge through a current induced by a first edge of electrical pulse 208 and capacitor 226 is configured to release charge through a current induced by a second edge of electrical pulse. After both edges of the electrical pulse 208 have induced changes in the amounts of charge stored by the capacitors 224 and 226, the capacitors may be read differentially at differential output 228. The differential sensing capabilities provided by system 100 may enable rejection of certain non-idealities in a transmission path coupled to the capacitors 224 and 226 and provide more accurate measurements of the capacitance of capacitive sensing channel 104 than systems using single ending sensing.

As shown in FIG. 2, system 100 further comprises a pulse driver 206, drive pad 210, receive pad 214, current conveyer 216, timing circuit 218, switches 220 and 222, and differential output 228. Pulse driver 206 is operable to generate electrical pulses 208 that each comprise a positive (i.e., rising) edge and a negative (i.e., falling) edge. In between the positive and negative edges, the pulse may remain generally constant for a period of time (i.e., at a high value after the positive edge and a low value after the negative edge). An electrical pulse 208 may be transmitted to a capacitive touch sensor 105 via drive pad 210. In various embodiments, drive pad 210 is coupled to a drive line 103($x$) of the capacitive touch sensor 105. Drive pad 210 is operable to allow transmission of the electrical pulse 208 to the drive line 103($x$).

The electrical pulse 208 is transmitted to one side of a capacitive sensing channel 104 of the capacitive touch sensor. The positive and negative edges of the electrical pulse 208 may induce a charge shift on the opposite side of the capacitive sensing channel 104. In some embodiments, the opposite side of the capacitive sensing channel 104 is coupled to a sense line 103($y$) of the capacitive touch sensor 105. The sense line 103($y$) is coupled to receive pad 214 of control unit 150. The charges induced by the edges of electrical pulse 208 may result in a current through receive pad 214 and current conveyer 216 of control unit 150. A positive edge of electrical pulse 208 may result in current flowing through the receive pad and toward the current conveyer 216 and node 221 (assuming at least one of the switches 220 or 222 is closed). A negative edge of electrical pulse 208 may result in current flowing in the opposite direction.

Current conveyer 216 may be any suitable transmission medium that allows current to flow in between receive pad 214 and the two capacitors 224 and 226. In some embodiments, current conveyer 216 may comprise a current amplifier with an adjustable gain control. Current conveyer 216 may be operable to receive an amount of current from receive pad 214, amplify the current by the adjustable gain, and allow the amplified current to flow towards node 221. Similarly, current conveyer 216 may be operable to receive an amount of current from node 221, amplify the current by the adjustable gain, and allow the amplified current to flow towards receive pad 214.

Timing circuit 218 may be operable to couple capacitor 224 and/or 226 to the current conveyer 216 at any appropriate time. Timing circuit 218 may couple capacitors 224 and 226 to the current conveyer 216 by any appropriate means, such as switches 220 and 222. When a capacitor, such as capacitor 224, is coupled to the current conveyer 216, the current induced by electrical pulse 208 may charge or discharge the capacitor (depending on whether the current is induced by the positive or negative edge of the electrical pulse).

An embodiment of the present disclosure utilizes two sampling capacitors 224 and 226 for differential integration of a signal indicative of the capacitance of capacitive sensing channel 104. In some embodiments, the size of capacitor 224 is approximately equal to the size of capacitor 226. In some embodiments, capacitor 224 is configured to collect charge through a current induced by a first edge of electrical pulse 208 and capacitor 226 is configured to release charge through a current induced by a second edge of electrical pulse. In various embodiments, the first edge may be the positive edge and the second edge may be the negative edge, or the first edge may be the negative edge and the second edge may be the positive edge. In a particular embodiment, capacitor 224 is configured to collect charge through a current induced by the positive edge of electrical pulse 208 and capacitor 226 is configured to release charge through a current induced by the negative edge of electrical pulse. After both edges of the electrical pulse 208 are received, the capacitors 224 and 226 may be read differentially at differential output 228.

Certain embodiments of the present disclosure may provide some, none, or all of the following technical advantages. For example, certain embodiments may differentially sense a signal that is indicative of a capacitance of an area (such as a capacitive sensing channel 104) of a capacitive touch sensor 105. Such embodiments may enable rejection of certain non-idealities in a transmission path coupled to the capacitors 224 and 226 that store a measurement of the capacitance. Such embodiments may further allow for more accurate measurements of a capacitance of an area of a capacitive touch sensor.

Figure 3A:
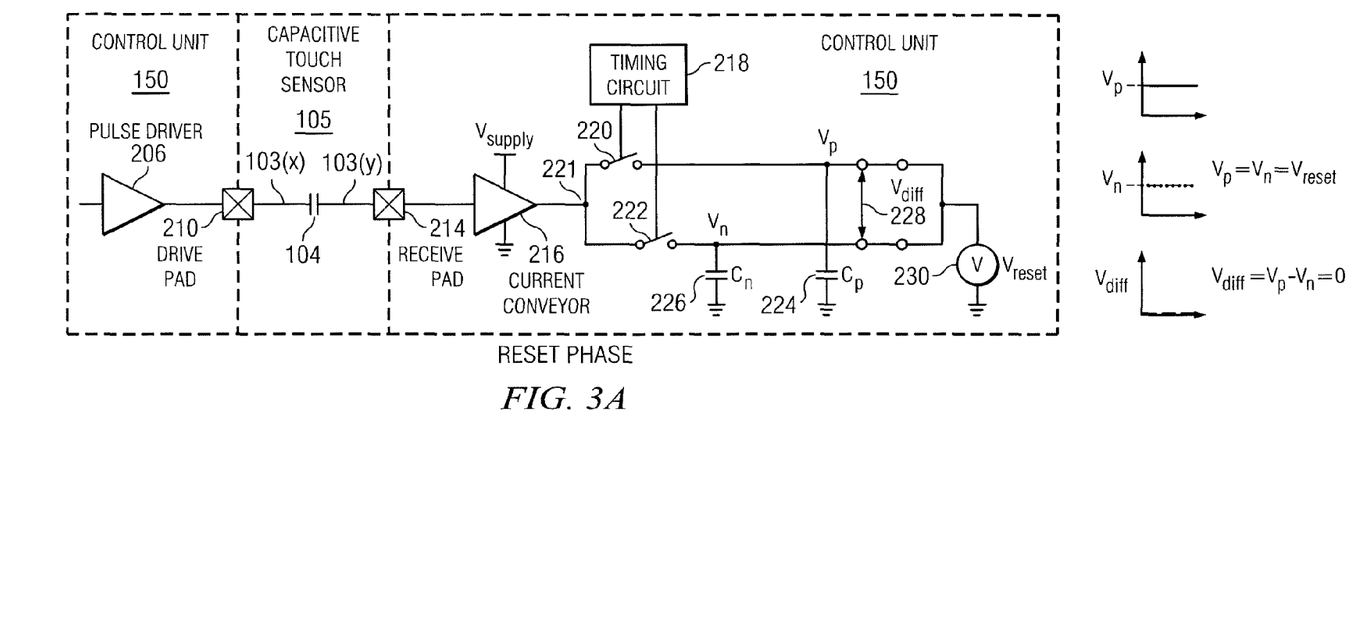
FIGS. 3A-3C illustrate various states of operation of the system of FIG. 2.
Figure 3B:
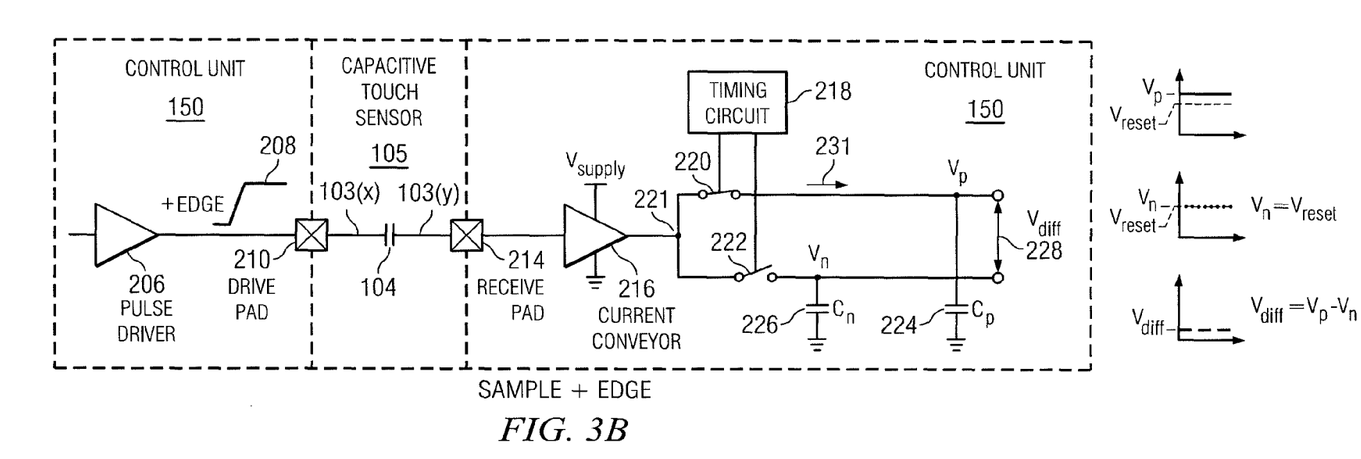
Figure 3C:
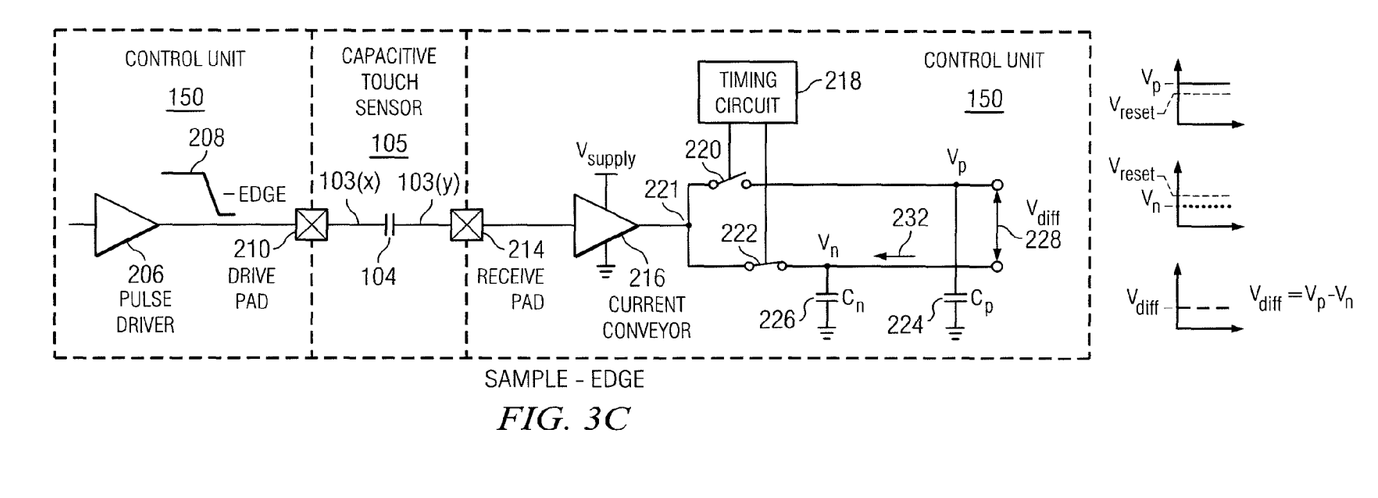
Figure 4:
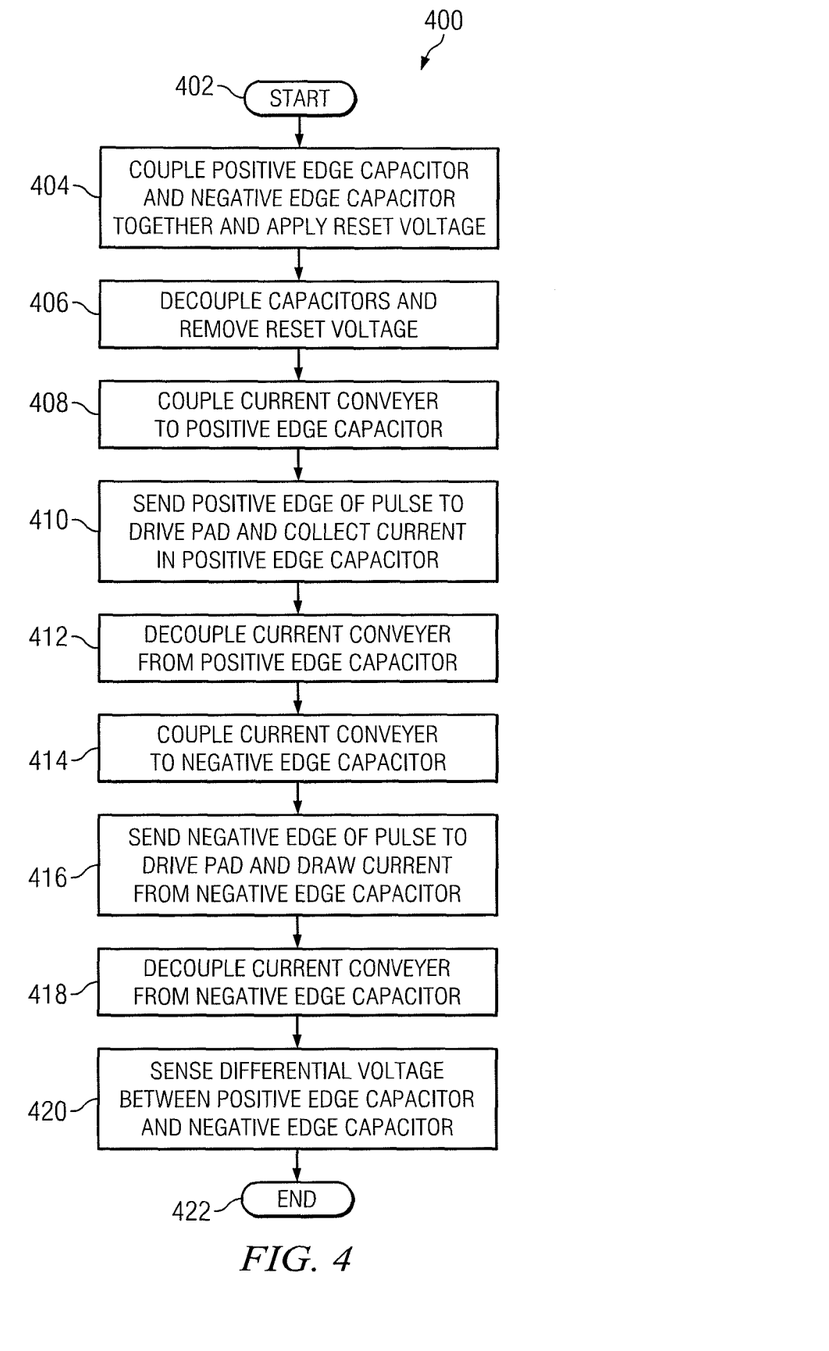
FIG. 4 illustrates an example method for differentially sampling a capacitance of an area of a capacitive touch sensor.

FIGS. 3A-3C illustrate various states of operation of the system 100. These states will be described in connection with an example method 400 for differentially sampling a capacitance of an area of a capacitive touch sensor as depicted in FIG. 4.

The method begins at step 402. At step 404, a positive edge capacitor and negative edge capacitor are coupled together and a reset voltage is applied to each capacitor. For purposes of illustration, a positive edge capacitor is a capacitor that collects charge as a result of a rising edge of an electrical pulse and a negative edge capacitor is a capacitor that discharges as a result of a falling edge of an electrical pulse. In FIGS. 3A-3C, capacitor 224 corresponds to a positive edge capacitor since it collects charge during the positive edge of electrical pulse 208, and capacitor 226 corresponds to a negative edge capacitor since it discharges during the negative edge of electrical pulse 208. Of course, in an alternative embodiment, capacitor 224 could collect charge during a negative edge and capacitor 226 could discharge during a positive edge of the electrical pulse 208.

During the reset phase, the capacitors may be coupled to each other and the reset voltage source or a voltage buffer in any suitable manner, such as through one or more switches. As depicted in FIG. 3A, capacitors 224 and 226 are coupled together and each capacitor is reset to an initial voltage level ($V_{reset}$) by reset voltage source 230. In some embodiments, the reset voltage source 230 applies a direct current (DC) voltage to capacitors 224 and 226. In some embodiments, the reset voltage is approximately one half of a supply voltage (e.g., $V_{supply}$) of control unit 150 to maximize the allowable voltage swing on each of the capacitors before ground or $V_{supply}$ is reached.

The graphs at the right of FIGS. 3A-3C show the voltage level of capacitors 224 ($V_p$) and 226 ($V_n$) and the voltage level of the differential output 228 ($V_{diff}$) at the various stages. After the capacitors are reset to $V_{reset}$, the voltage of the differential output 228 is zero. In particular embodiments, as depicted, timing circuit 218 holds switches 220 and 222 open while the reset voltage 230 is applied to capacitors 224 and 226. At step 406, the positive edge capacitor 224 and negative edge capacitor 226 are decoupled from each other and the reset voltage supply 230.

At step 408, the current conveyer is coupled to the positive edge capacitor. For example, FIG. 3B depicts current conveyer 216 coupled to capacitor 224 via closed switch 220. In some embodiments, timing circuit 218 may close switch 220 to couple capacitor 224 to the current conveyer. In an embodiment, switch 220 is closed after the reset voltage 230 is applied and before the positive edge of electrical pulse 208 induces current through current conveyer 216. In an embodiment, timing circuit 218 may hold switch 220 closed and switch 222 open for at least the duration of the positive edge of the electrical pulse 208.

At step 410, a positive edge of a pulse is sent to a drive pad and current is collected in the positive edge capacitor. FIG. 3B depicts the positive edge of electrical pulse 208 being sent to drive pad 210. The pulse may be transmitted through drive pad 210 to one side of a capacitive sensing channel 104 of capacitive touch sensor 105. This may induce a current 231 that flows through current conveyer 216 to capacitor 224. Since the magnitude of current 231 is dependent on the value of the capacitance of capacitive sensing channel 104, the amount of charge collected in capacitor 224 as a result of the positive edge of the electrical pulse 108 is indicative of this capacitance. As shown in the graph, after the positive edge of electrical pulse 208, the voltage across capacitor 224 ($V_p$) is greater than its initial voltage ($V_{reset}$).

At step 412, the current conveyer is decoupled from the positive edge capacitor. For example, current conveyer 216 may be decoupled from capacitor 224 via the opening of switch 220. In some embodiments, timing circuit 218 may open switch 220. Switch 220 may be opened after the positive edge of electrical pulse 208 and before the negative edge of the pulse.

At step 414, the current conveyer is coupled to the negative edge capacitor. For example, FIG. 3C depicts current conveyer 216 coupled to capacitor 226 via closed switch 222. In some embodiments, timing circuit 218 may close switch 222 to couple capacitor 226 to the current conveyer 216. In an embodiment, switch 222 is closed between the positive edge and the negative edge of electrical pulse 208. In an embodiment, timing circuit 218 may hold switch 222 closed and switch 220 open for at least the duration of the negative edge of the electrical pulse 208.

At step 416, a negative edge of a pulse is sent to a drive pad and current is drawn from the negative edge capacitor. FIG. 3C depicts the negative edge of electrical pulse 208 being sent to drive pad 210. The pulse may be transmitted through drive pad 210 to one side of a capacitive sensing channel 104 of capacitive touch sensor 105. This may induce a current 232 that flows from capacitor 226 through current conveyer 216. Since the magnitude of the current 232 is dependent on the value of the capacitance of capacitive sensing channel 104, the amount of charge drawn from capacitor 226 is indicative of this capacitance. As shown, after the negative edge of electrical pulse 208, the voltage across capacitor 226 ($V_n$) is less than its initial voltage ($V_{reset}$).

At step 418, the current conveyer is decoupled from the negative edge capacitor. For example, current conveyer 216 may be decoupled from capacitor 226 via the opening of switch 222. In some embodiments, timing circuit 218 may open switch 222. Switch 222 may be opened after the negative edge of electrical pulse 208.

At step 420, the differential voltage between the positive edge capacitor and the negative edge capacitor is sensed. As depicted in FIG. 3C, the differential voltage 228 ($V_{diff}$) is equal to the voltage on capacitor 224 ($V_p$) minus the voltage on capacitor 226 ($V_n$). The voltage may be provided to at least a portion of a backend circuit. In some embodiments, the backend circuit may sense the voltage level of differential output 228 and convert it into a digital value. In a particular embodiment, the backend circuit is an analog to digital converter (ADC).

In typical systems, a backend circuit, such as an ADC, has its own sampling capacitors. Thus, the charge stored in the integrating capacitors 224 and 226 would have to be transferred to the sampling capacitors of the backend circuit before being processed by the backend circuit. This results in a loss of speed, charge redistribution error, and increased circuit area.

In a particular embodiment, capacitors 224 and 226 comprise the sampling capacitors of the backend circuit (e.g., an ADC). That is, capacitors 224 and 226 may be merged with the sampling capacitors of the backend circuit. Such an embodiment results in increased system speed, significantly reduced charge redistribution error, and lower circuit area.

The method 400 ends at step 422. The method may be repeated by returning to step 404 and resetting the voltages of the capacitors to the reset voltage. In some embodiments, this method 400 may be performed for a plurality of capacitive sensing channels 104 of the capacitive touch sensor 105 and a result calculated by a backend circuit may be stored for each capacitive sensing channel that is measured. In an embodiment, steps 408-418 may be performed multiple times before step 420 is performed. That is, multiple electrical pulses 208 may be sent to the capacitive sensing channel 104 before the voltage level of the differential output 228 is sensed (assuming that multiple pulses would not cause capacitors 224 and 226 to clip at the supply voltage or ground).

Although this disclosure describes and illustrates particular steps of the method of FIG. 4 as occurring in a particular order, this disclosure contemplates any suitable steps of the method of FIG. 4 occurring in any suitable order. Moreover, although this disclosure describes and illustrates particular illustrates particular components carrying out particular steps of the method of FIG. 4, this disclosure contemplates any suitable combination of any suitable components carrying out any suitable steps of the method of FIG. 4.

Figure 5:
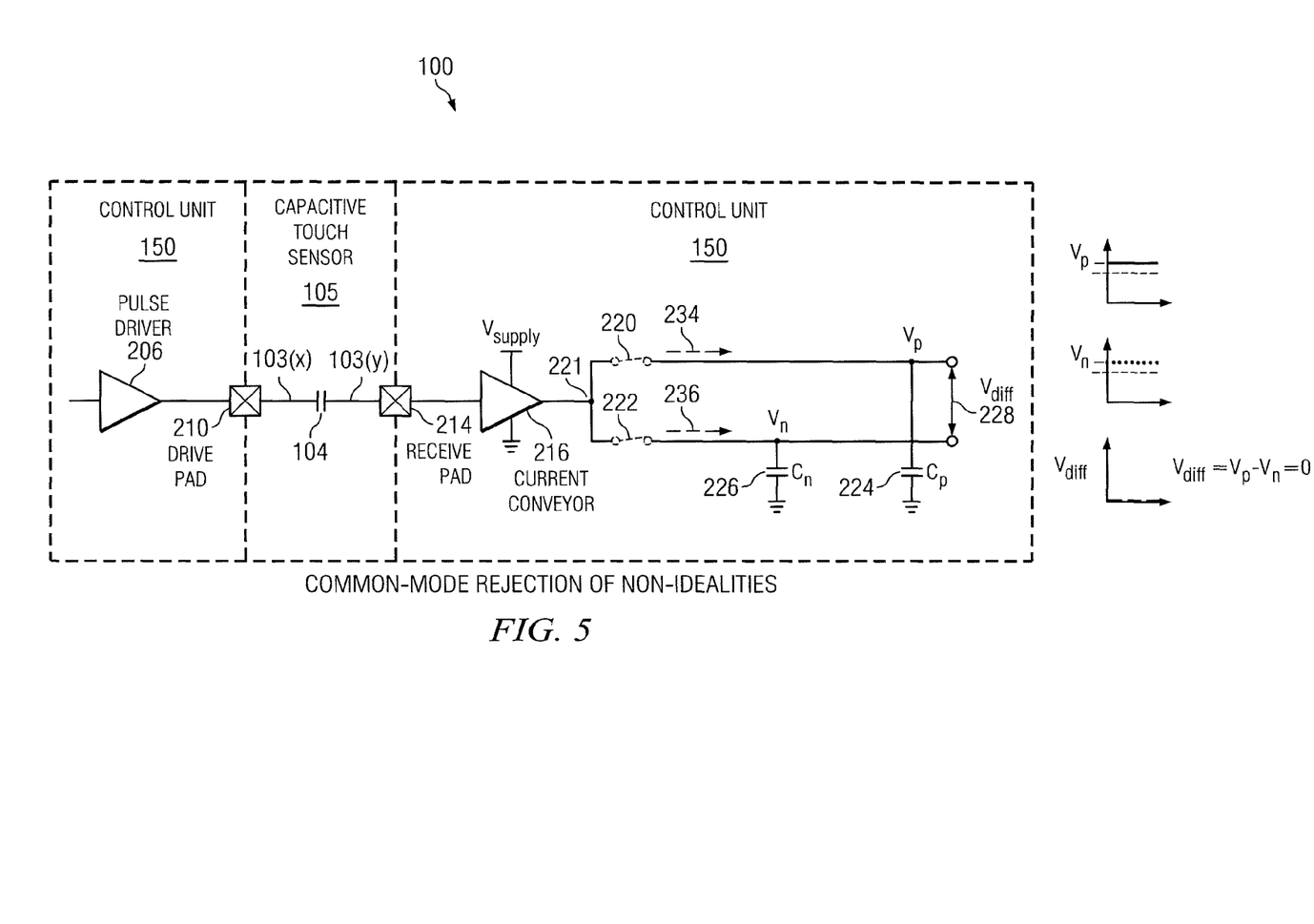
FIG. 5 illustrates an example embodiment of the system of FIG. 2 illustrating common-mode rejection of non-idealities.

FIG. 5 illustrates a desirable result that may be achieved by some embodiments of the present disclosure. In particular, FIG. 5 is a circuit diagram of an embodiment of system 100 with annotations showing common-mode rejection of non-idealities. In the embodiment depicted, currents 234 and 236 represent currents resulting from the non-idealities of the path between capacitive sensing channel 104 and node 221. Current 234 represents the current that results from non-idealities while switch 220 is closed during steps 408 and 410 of method 400 as illustrated in FIG. 3B. Current 236 represents the current that results from non-idealities while switch 222 is closed during steps 414 and 416 of method 400 as illustrated in FIG. 3C.

As depicted, non-idealities (such as an amplifier offset error of current conveyer 216) in the circuit path may result in the same amount of increased (or decreased) charge on each capacitor 224 and 226. Because the path is coupled to both capacitors, the non-idealities of the path affects each capacitor in a similar manner. By taking the differential voltage across the paths, these non-idealities may be canceled out ($V_{diff}=0$). In some embodiments, timing circuit 218 may be configured to close switches 220 and 222 for an equivalent amount of time when they are respectively measuring the positive edge and the negative edge of electrical pulse 208 so that the non-idealities of the circuit path have a similar magnitude of effect on each capacitor 224 and 226. Thus, the differential integration capability provided by system 100 is operable to convert at least some of the non-idealities of the path from capacitive sensing channel 104 to node 221 into common-mode variation and reject them. This results in a decreased sensitivity to noise, an increase in the range of signals that may be measured, and an improvement in the accuracy of the measurements.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. An apparatus comprising:
    a pulse driver configured to generate a plurality of electrical pulses for transmission to a capacitive touch sensor;
    a timing circuit coupled to a first switch and a second switch, the first switch and the second switch coupled in parallel to a sense line of the capacitive touch sensor, the timing circuit configured to:
        hold the first switch closed and the second switch open for the duration of a first edge of a first electrical pulse, the first edge comprising a rising edge of the first electrical pulse; and
        hold the second switch closed and the first switch open for the duration of a second edge of the first electrical pulse, the second edge comprising a falling edge of the first electrical pulse, the first electrical pulse held generally constant between the falling edge and the rising edge;
    a first capacitor operable to be coupled to the sense line of the capacitive touch sensor through the first switch, the first capacitor configured to receive, while the first switch is closed during the duration of the rising edge of the first electrical pulse, a first amount of charge that is indicative of a capacitance of an area of the capacitive touch sensor;
    a second capacitor operable to be coupled to the sense line of the capacitive touch sensor through the second switch, the second capacitor configured to discharge, while the second switch is closed during the duration of the falling edge of the first electrical pulse, a second amount of charge that is indicative of the capacitance of the area of the capacitive touch sensor; and
    a differential output coupled to the first capacitor and second capacitor, the differential output configured to provide, to a portion of a backend circuit, a measure of the voltage difference between the first capacitor and second capacitor.

2. The apparatus of claim 1, further comprising:
a voltage source or voltage buffer removably coupled to the first capacitor and the second capacitor and configured to set the first capacitor and the second capacitor to a common voltage.

3. The apparatus of claim 1, further comprising:
a voltage source or voltage buffer configured to set the first capacitor and the second capacitor to a common voltage, the common voltage equal to approximately half of a supply voltage of the apparatus.

4. The apparatus of claim 1, wherein:
the backend circuit comprises an analog to digital converter; and
the first capacitor and the second capacitor collectively comprise the sampling capacitors of the analog to digital converter.

5. The apparatus of claim 1, further comprising:
a current conveyer coupled between the capacitive touch sensor and the first and second switches, the current conveyer configured to supply the first amount of charge to the first capacitor and receive the second amount of charge from the second capacitor.

6. The apparatus of claim 5, wherein:
the current conveyer comprises an adjustable gain control circuit configured to amplify a current received from the capacitive touch sensor.

7. The apparatus of claim 1, wherein:
the first capacitor and the second capacitor are approximately the same size.

8. A method comprising:
generating a first electrical pulse for transmission to a capacitive touch sensor;
holding a first switch closed and a second switch open to couple a first capacitor to a sense line of the capacitive touch sensor for the duration of a first edge of the first electrical pulse, the first edge comprising a rising edge of the first electrical pulse, the first switch and the second switch coupled in parallel to the sense line of the capacitive touch sensor;
receiving, at the first capacitor during the duration of the rising edge of the first electrical pulse, a first amount of charge from the sense line through a current induced by the rising edge of the first electrical pulse;
holding the first switch open and the second switch closed to couple a second capacitor to the sense line of the capacitive touch sensor for the duration of a second edge of the electrical pulse, the second edge comprising a falling edge of the first electrical pulse, the first electrical pulse held generally constant between the falling edge and the rising edge;
discharging, from the second capacitor while the second switch is closed during the duration of the falling edge of the first electrical pulse, a second amount of charge from the sense line through a current induced by the falling edge of the first electrical pulse; and
providing, by a differential output, a measure of the voltage difference between the first capacitor and second capacitor to a portion of a backend circuit.

9. The method of claim 8, further comprising:
setting, by a voltage source or voltage buffer removably coupled to the first capacitor and the second capacitor, the first capacitor and the second capacitor to a common voltage.

10. The method of claim 8, further comprising:
prior to generating the electrical pulse, setting the first capacitor and the second capacitor to a common voltage, the common voltage equal to approximately half of a supply voltage.

11. The method of claim 8, wherein:
the backend circuit comprises an analog to digital converter; and
the first capacitor and the second capacitor collectively comprise the sampling capacitors of the analog to digital converter.

12. The method of claim 8, further comprising:
supplying, by a current conveyer coupled between the capacitive touch sensor and the first and second capacitors, the first amount of charge to the first capacitor; and
receiving, by the current conveyer, the second amount of charge from the second capacitor.

13. The method of claim 12, further comprising:
amplifying a current received from the capacitive touch sensor according to a gain set by an adjustable gain control circuit of the current conveyer.

14. The method of claim 8, wherein:
the first capacitor and the second capacitor are approximately the same size.

15. An apparatus, comprising:
a capacitive touch sensor comprising a plurality of nodes; and
a control unit coupled to the capacitive touch sensor, the control unit comprising:
a pulse driver configured to generate a plurality of electrical pulses for transmission to a node of the plurality of nodes of the capacitive touch sensor;
a timing circuit coupled to a first switch and a second switch, the first switch and the second switch coupled in parallel to a sense line associated with the node of the capacitive touch sensor, the timing circuit configured to:
hold the first switch closed and the second switch open for the duration of a first edge of the first electrical pulse, the first edge comprising a rising edge of the first electrical pulse; and
hold the second switch closed and the first switch open for the duration of a second edge of the first electrical pulse, the second edge comprising a falling edge of the first electrical pulse, the first electrical pulse held generally constant between the falling edge and the rising edge;
a first capacitor selectively coupled to the sense line associated with the node of the capacitive touch sensor through the first switch, the first capacitor configured to receive, while the first switch is closed during the duration of the rising edge of the first electrical pulse, a first amount of charge that is indicative of a capacitance of the node of the capacitive touch sensor;
a second capacitor selectively coupled to the sense line associated with the node of the capacitive touch sensor through the second switch, the second capacitor configured to discharge, while the second switch is closed during the duration of the falling edge of the first electrical pulse, a second amount of charge that is indicative of the capacitance of the node of the capacitive touch sensor; and
a differential output coupled to the first capacitor and second capacitor, the differential output configured to provide, to a portion of a backend circuit, a measure of the voltage difference between the first capacitor and second capacitor.

16. The apparatus of claim 15, further comprising:
a voltage source or voltage buffer removably coupled to the first capacitor and the second capacitor and configured to set the first capacitor and the second capacitor to a common voltage.

17. The apparatus of claim 15, further comprising:
a voltage source or voltage buffer configured to set the first capacitor and the second capacitor to a common voltage, the common voltage equal to approximately half of a supply voltage of the apparatus.

18. The apparatus of claim 15, wherein:
the backend circuit comprises an analog to digital converter; and
the first capacitor and the second capacitor collectively comprise the sampling capacitors of the analog to digital converter.

19. The apparatus of claim 15, further comprising:
a current conveyer coupled between the node of the capacitive touch sensor and the first and second switches, the current conveyer configured to supply the first amount of charge to the first capacitor and receive the second amount of charge from the second capacitor.

20. The apparatus of claim 19, wherein:
the current conveyer comprises an adjustable gain control circuit configured to amplify a current received from the second electrode.

21. The apparatus of claim 15, wherein:
the first capacitor and the second capacitor are approximately the same size.

\* \* \* \* \*